(12) United States Patent
Jo et al.

(10) Patent No.: US 11,893,940 B2
(45) Date of Patent: Feb. 6, 2024

(54) DISPLAY DEVICE

(71) Applicant: Samsung Display Co., Ltd., Yongin-si (KR)

(72) Inventors: Kangmoon Jo, Yongin-si (KR); Ansu Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/198,858

(22) Filed: Mar. 11, 2021

(65) Prior Publication Data

US 2021/0287606 A1  Sep. 16, 2021

(30) Foreign Application Priority Data

Mar. 13, 2020 (KR) .................. 10-2020-0031308

(51) Int. Cl.
*G09G 3/3258* (2016.01)
*G09G 3/3266* (2016.01)
(Continued)

(52) U.S. Cl.
CPC ......... *G09G 3/3258* (2013.01); *G09G 3/3208* (2013.01); *G09G 3/3266* (2013.01);
(Continued)

(58) Field of Classification Search
CPC ............. H01L 27/3265; H01L 27/3262; H01L 27/3276; H01L 27/3272; H01L 27/3248; H01L 27/3244; H01L 27/124; H01L 27/1255; H01L 27/32; H01L 27/3216; H01L 27/322; H01L 29/78633; H01L 51/5284; H01L 27/3211; H01L 51/5012; H01L 27/3206; H01L 27/3202; H01L 51/502; H01L 27/14603; H01L 27/32416; H01L 27/326; H01L 27/1214; H01L 27/3258; H01L 27/1225; H01L 27/1259; G09G 3/3233; G09G 3/3225; G09G 3/3208; G09G 3/32; G09G 2300/0842; G09G 2300/0426; G09G 2300/0852;
(Continued)

(56) References Cited

U.S. PATENT DOCUMENTS 9,406,264 B2  8/2016  Kang et al.
10,297,194 B2  5/2019  Kim
(Continued)

FOREIGN PATENT DOCUMENTS

JP  2004-117690  4/2004
KR  10-2012-0045286  5/2012
(Continued)

*Primary Examiner* — Dismery Mercedes
(74) *Attorney, Agent, or Firm* — KILE PARK REED & HOUTTEMAN PLLC

(57) ABSTRACT

A display device includes a light-emitting panel including a first light-emitting diode, a second light-emitting diode, a third light-emitting diode, and transistors. The display device includes a color panel disposed on the light-emitting panel and including a first color area, a second color area, a third color area, and a light-shielding area. The light-emitting panel includes a scan line extending in a first direction; data lines extending in a second direction intersecting the first direction; and storage capacitors disposed adjacent to one another in the second direction.

20 Claims, 11 Drawing Sheets

(51) Int. Cl.
*H01L 27/12* (2006.01)
*H10K 59/10* (2023.01)
*H10K 59/121* (2023.01)
*G09G 3/3291* (2016.01)
*H10K 59/38* (2023.01)
*G09G 3/3208* (2016.01)
*H10K 59/123* (2023.01)

(52) U.S. Cl.
CPC ......... *G09G 3/3291* (2013.01); *H01L 27/124* (2013.01); *H01L 27/1255* (2013.01); *H10K 59/10* (2023.02); *H10K 59/123* (2023.02); *H10K 59/1216* (2023.02); *H10K 59/38* (2023.02); *G09G 2300/0426* (2013.01); *G09G 2300/0452* (2013.01); *G09G 2300/0852* (2013.01)

(58) Field of Classification Search
CPC ......... G09G 2300/0439; G09G 3/3258; G09G 3/3266; G09G 3/3688; H10K 59/131; H10K 59/38; H10K 59/126; H10K 59/122; H10K 59/1216; H10K 59/1213; H10K 59/12; H10K 59/124; H10K 59/123; H10K 59/35; H10K 50/865; H10K 59/40; H10K 59/352; G02F 1/136286; G02F 1/133603; G02F 1/133514; G02F 1/136213
See application file for complete search history.

(56) References Cited

U.S. PATENT DOCUMENTS

| | | | | |
|---|---|---|---|---|
| 2005/0259142 A1* | 11/2005 | Kwak | ................ | A61P 1/16 347/238 |
| 2007/0115226 A1* | 5/2007 | Jung | ................ | G09G 3/3233 345/76 |
| 2011/0279734 A1* | 11/2011 | Tsubata | ................ | G02F 1/13624 348/731 |
| 2012/0104939 A1* | 5/2012 | Park | ................ | H01L 27/3218 313/504 |
| 2013/0063330 A1* | 3/2013 | Eom | ................ | H10K 59/352 345/80 |
| 2013/0120341 A1* | 5/2013 | Kasai | ................ | G09G 3/3291 345/211 |
| 2014/0291636 A1* | 10/2014 | Kim | ................ | H10K 59/1216 438/34 |
| 2015/0009106 A1* | 1/2015 | Lee | ................ | G09G 3/3233 345/77 |
| 2015/0130785 A1* | 5/2015 | Shin | ................ | G09G 5/18 345/82 |
| 2015/0243722 A1* | 8/2015 | Kwon | ................ | H01L 29/78675 257/40 |
| 2016/0064673 A1* | 3/2016 | Park | ................ | H01L 27/3258 257/40 |
| 2016/0189663 A1* | 6/2016 | Hwang | ................ | G09G 3/3225 345/82 |
| 2016/0321991 A1* | 11/2016 | Song | ................ | H01L 51/5218 |
| 2017/0053975 A1* | 2/2017 | Cho | ................ | H01L 27/1288 |
| 2017/0194402 A1* | 7/2017 | Choi | ................ | H10K 50/822 |
| 2017/0317155 A1* | 11/2017 | Oh | ................ | H10K 59/1213 |
| 2018/0088404 A1* | 3/2018 | Chae | ................ | H10K 59/38 |
| 2018/0166015 A1* | 6/2018 | Beak | ................ | H10K 59/1216 |
| 2019/0189728 A1* | 6/2019 | Lee | ................ | H01L 51/5253 |
| 2021/0063784 A1* | 3/2021 | Wang | ................ | G02B 6/0068 |
| 2021/0098557 A1* | 4/2021 | Lee | ................ | H01L 27/3276 |
| 2021/0111236 A1* | 4/2021 | Yoon | ................ | H10K 59/38 |
| 2021/0202602 A1* | 7/2021 | Yuan | ................ | G09G 3/3258 |
| 2021/0202643 A1* | 7/2021 | Lee | ................ | H10K 59/351 |
| 2022/0013612 A1* | 1/2022 | Xu | ................ | H10K 59/1213 |

FOREIGN PATENT DOCUMENTS

| | | |
|---|---|---|
| KR | 10-1675839 | 11/2016 |
| KR | 10-2018-0024910 | 3/2018 |
| KR | 10-1969952 | 4/2019 |

* cited by examiner

DISPLAY DEVICE

CROSS-REFERENCE TO RELATED APPLICATION(S)

This application claims priority to and benefits of Korean Patent Application No. 10-2020-0031308 under 35 U.S.C. § 119, filed in the Korean Intellectual Property Office on Mar. 13, 2020, the entire contents of which is incorporated herein by reference.

BACKGROUND

1. Technical Field

One or more embodiments relate to a display device.

2. Description of the Related Art

As displays representing various electrical signal information have been rapidly developed, various display devices having excellent characteristics such as a small thickness, a light weight, and low power consumption have been introduced.

A display device may include a liquid-crystal display device that does not emit light directly, instead using light of a backlight, or a light-emitting display device including a display element capable of emitting light. The light-emitting display device may include display elements including a pixel electrode, a counter electrode, and an emission layer located between the pixel electrode and the counter electrode.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments of the disclosure relate to a display device and, more particularly, provide a structure of a light-emitting display device.

Additional aspects will be set forth in part in the description which follows and, in part, will be apparent from the description, or may be learned by practice of the presented embodiments of the disclosure.

According to one or more embodiments, a display device may include a light-emitting panel including a first light-emitting diode, a second light-emitting diode, a third light-emitting diode, and transistors, and a color panel disposed on the light-emitting panel, the color panel including a first color area, a second color area, a third color area, and a light-shielding area, wherein the first, second, and third color areas may include different colors. The light-emitting panel may include a scan line extending in a first direction, data lines extending in a second direction intersecting the first direction, and storage capacitors disposed adjacent to one another in the second direction.

The storage capacitors may include a first storage capacitor adjacent to the scan line, a second storage capacitor adjacent to the first storage capacitor in the second direction, and a third storage capacitor adjacent to the second storage capacitor in the second direction.

The transistors may include a first driving transistor electrically connected to the first storage capacitor.

The first storage capacitor may include a first electrode electrically connected to a gate electrode of the first driving transistor, and a second electrode overlapping the first electrode, wherein the second electrode may include a first sub-electrode disposed under the first electrode, and a second sub-electrode disposed over the first electrode and electrically connected to the first sub-electrode.

The first light-emitting diode may include a first pixel electrode electrically connected to the first storage capacitor.

The first pixel electrode may overlap the first storage capacitor.

The first color area of the color panel may include a first color converter overlapping the first light-emitting diode, the first color converter including quantum dots for converting incident light into green light, and a green color filter overlapping the first color converter.

The light-emitting panel may further include a driving voltage line disposed at a first side of the storage capacitors, and the data lines disposed at a second side of the storage capacitors.

The first light-emitting diode, the second light-emitting diode, and the third light-emitting diode may be disposed in the first direction, the first light-emitting diode may overlap the storage capacitors, the second light-emitting diode may overlap the driving voltage line, and the third light-emitting diode may overlap the data lines.

The scan line of the display device may further include a branch extending in the second direction from the scan line.

The transistors may include a first switching transistor electrically connected to the scan line and a first data line of the data lines, a second switching transistor electrically connected to the scan line and a second data line of the data lines, and a third switching transistor electrically connected to the scan line and a third data line of the data lines, wherein a length of a semiconductor layer of the first switching transistor, a length of a semiconductor layer of the second switching transistor, and a length of a semiconductor layer of the third switching transistor may be different from one another.

According to one or more embodiments, a display device may include red, green, and blue pixels, a scan line extending in a first direction, data lines extending in a second direction intersecting the first direction, a driving voltage line extending in the second direction, storage capacitors disposed adjacent to one another in the second direction, and transistors electrically connected to the storage capacitors.

The storage capacitors may include a first storage capacitor adjacent to the scan line, a second storage capacitor adjacent to the first storage capacitor in the second direction, and a third storage capacitor adjacent to the second storage capacitor in the second direction.

The transistors may include a first switching transistor electrically connected to the scan line and a first data line of the data lines, the first switching transistor disposed adjacent to the first storage capacitor, a second switching transistor electrically connected to the scan line and a second data line of the data lines, the second switching transistor disposed adjacent to the second storage capacitor, and a third switching transistor electrically connected to the scan line and a third data line of the data lines, the third switching transistor disposed adjacent to the third storage capacitor.

The second switching transistor may be disposed between the first switching transistor and the third switching transistor in the second direction, and a length of a semiconductor layer of the second switching transistor may be greater than a length of a semiconductor layer of the first switching transistor and a length of a semiconductor layer of the third switching transistor.

The transistors may include a first driving transistor electrically connected to the first storage capacitor, and the first storage capacitor may include a first electrode electrically connected to a gate electrode of the first driving transistor, and a second electrode overlapping the first electrode.

The second electrode may include a first sub-electrode disposed under the first electrode, and a second sub-electrode disposed over the first electrode and electrically connected to the first sub-electrode.

The display device may further include a first light-emitting diode overlapping the first storage capacitor.

The first light-emitting diode may include a first pixel electrode electrically connected to the first storage capacitor.

The green pixel may overlap the storage capacitors.

Other features and advantages of the disclosure will become more apparent from the drawings, the claims, and the detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1A:
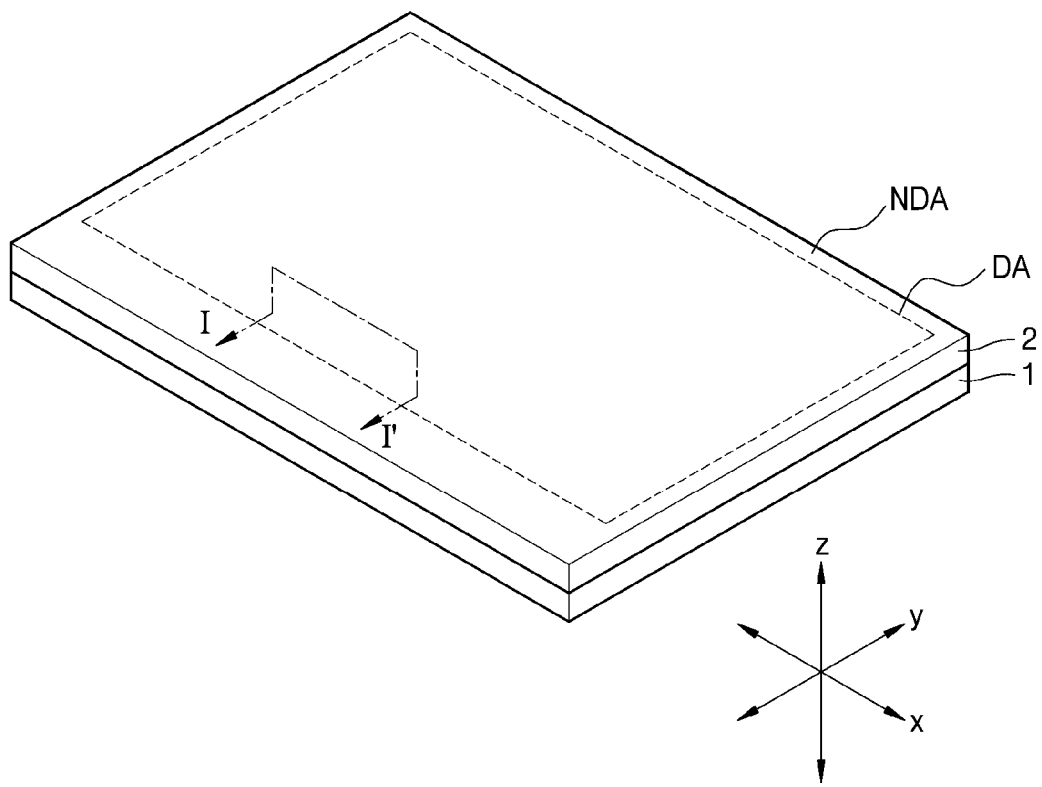
FIG. 1A is a schematic perspective view illustrating a display device according to an embodiment of the disclosure.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. The terms "and" and "or" may be used in the conjunctive or disjunctive sense and may be understood to be equivalent to "and/or." Throughout the disclosure, the expression "at least one of a, b or c" indicates only a, only b, only c, both a and b, both a and c, both b and c, all of a, b, and c, or variations thereof.

It will be understood that although the terms "first," "second," etc. may be used herein to describe various elements, these elements should not be limited by these terms and these terms are generally used only to distinguish one element from another.

As used herein, the singular forms "a," "an," and "the" are intended to include the plural forms as well, unless the context clearly indicates otherwise.

It will be further understood that the terms such as "comprises", "has", and "includes" used herein specify the presence of stated features or components, but do not preclude the presence or addition of one or more other features or components.

The term "overlap" may include "layer", "stack", "face" or "facing", "extending over", "extending under", "covering" or "partly covering" or any other suitable term as would be appreciated and understood by those of ordinary skill in the art.

In the drawings, sizes of elements may be exaggerated or contracted for convenience of explanation. For example, because sizes and thicknesses of elements in the drawings may be arbitrarily illustrated for convenience of explanation, the disclosure is not limited thereto.

When a certain embodiment may be implemented differently, a specific process order may be different from the described order. For example, two consecutively described processes may be performed substantially at the same time or performed in an order opposite to the described order.

It will be understood that when a layer, region, or element is referred to as being "formed on" another layer, region, or element, it may be directly formed on the other layer, region, or element or may be indirectly formed with intervening layers, regions, or elements therebetween. For example, when a layer, a region, or an element is electrically connected, the layer, the region, or the element may be directly electrically connected or may be indirectly electrically connected with intervening layers, regions, or elements therebetween.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 1B:
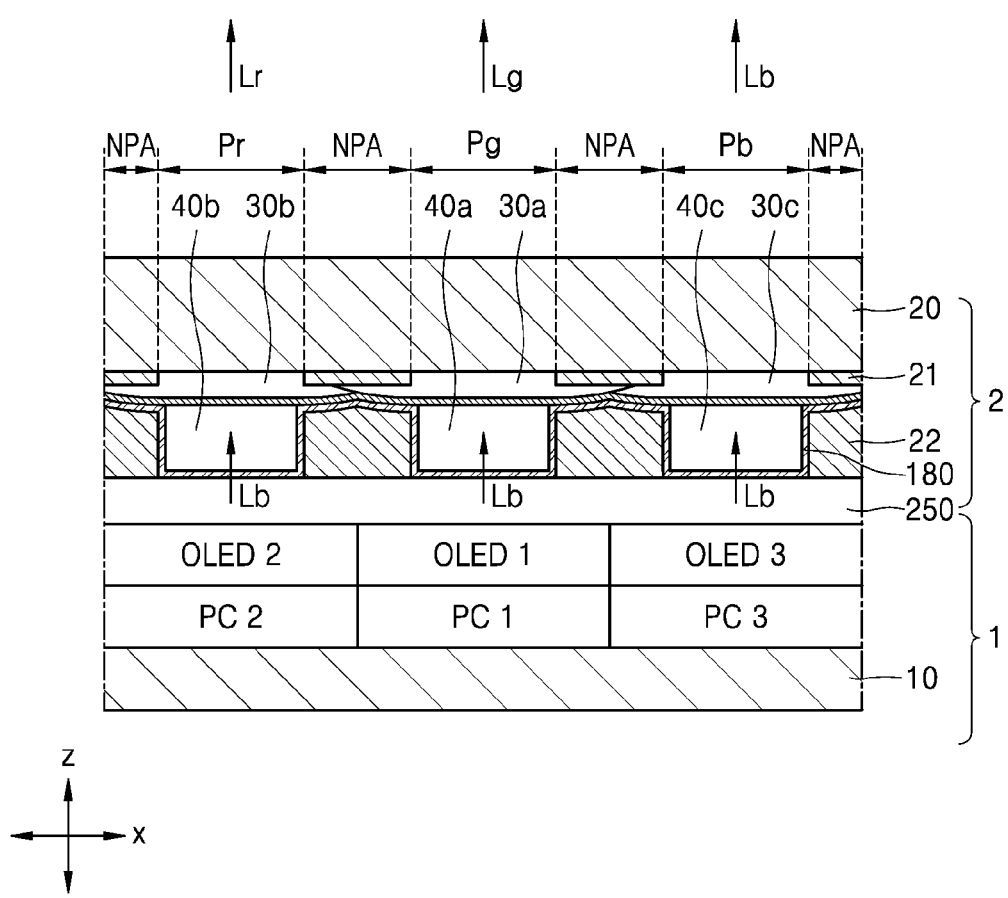
FIG. 1B is a schematic cross-sectional view taken along line I-I' of the display device according to an embodiment of the disclosure.
Figure 1C:
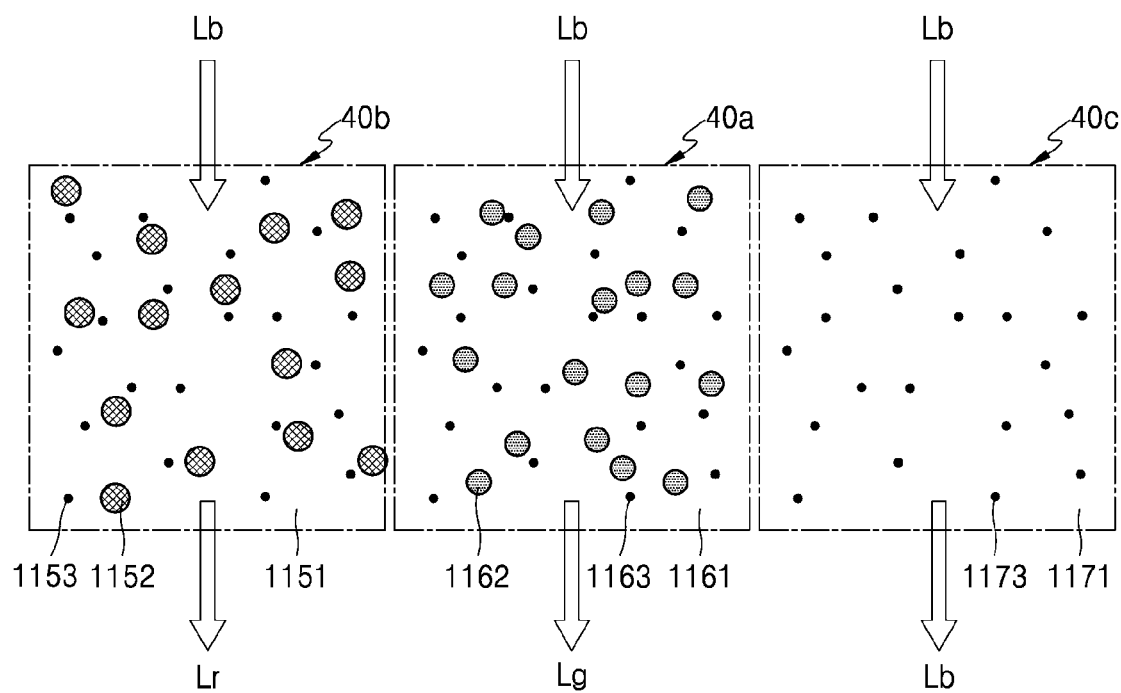
FIG. 1C is a schematic view illustrating parts of a color conversion-transmission layer of FIG. 1B.

FIG. 1A is a schematic perspective view illustrating a display device according to an embodiment of the disclosure. FIG. 1B is a schematic cross-sectional view taken along line I-I' of the display device according to an embodiment of the disclosure. FIG. 1C is a schematic view illustrating parts of a color conversion-transmission layer of FIG. 1B.

Referring to FIG. 1A, a display device may include a display area DA and a non-display area NDA outside the display area DA. The display device may provide an image through an array of pixels that may be two-dimensionally arranged in the display area DA.

Each pixel of the display device may be an area where light of a certain color may be emitted, and the display device may provide an image by using light emitted from pixels. For example, each pixel may emit red, green, or blue light.

The non-display area NDA where an image may not be provided may entirely surround the display area DA. A driver or a main power supply line for providing power or an electrical signal to pixel circuits may be located in the non-display area NDA. A pad to which an electronic device or a printed circuit board may be electrically connected may be included in the non-display area NDA.

The display area DA may have a polygonal shape including a quadrangular shape as shown in FIG. 1A. For example, the display area DA may have a rectangular shape having a horizontal length greater than a vertical length, a rectangular shape having a horizontal length less than a vertical length, or a square shape. In another embodiment, the display area DA may have any of various shapes such as an elliptical shape or a circular shape.

In some embodiments, the display device may include a light-emitting panel 1 and a color panel 2 stacked in a thickness direction (e.g., a z-direction). Referring to FIG. 1B, the light-emitting panel 1 may include first through third pixel circuits PC1, PC2, and PC3 on a first substrate 10, and first through third organic light-emitting diodes OLED1, OLED2, and OLED3 electrically connected to the first through third pixel circuits PC1, PC2, and PC3, respectively. The first through third organic light-emitting diodes OLED1, OLED2, and OLED3 may be covered by an encapsulation layer 250. The encapsulation layer 250 may include at least one of inorganic encapsulation layer and at least one of organic encapsulation layer.

Light (e.g., blue light Lb) emitted from the first through third organic light-emitting diodes OLED1, OLED2, and OLED3 may pass through the color panel 2 to be converted into green light Lg, red light Lr, and blue light Lb or to be transmitted. An area where the green light Lg may be emitted corresponds to a green pixel Pg, an area where the red light Lr may be emitted corresponds to a red pixel Pr, and an area where the blue light Lb may be emitted corresponds to a blue pixel Pb.

The color panel 2 may include a second substrate 20 and a first light-shielding layer 21 on the second substrate 20. The first light-shielding layer 21 may have holes formed by removing portions corresponding to the green pixel Pg, the red pixel Pr, and the blue pixel Pb. The first light-shielding layer 21 may include a material portion located in a non-pixel area NPA, and the material portion may include any of various materials capable of absorbing light.

A second light-shielding layer 22 may be located over the first light-shielding layer 21. The second light-shielding layer 22 may include a material portion located in the non-pixel area NPA. The second light-shielding layer 22 may include any of various materials capable of absorbing light. The second light-shielding layer 22 may include a material that may be the same as or different from that of the first light-shielding layer 21.

The first light-shielding layer 21 and/or the second light-shielding layer 22 may include an opaque insulating material such as chromium oxide, molybdenum oxide, or a combination thereof, or may include an opaque organic insulating material such as black resin.

A color layer including first through third color filters 30a, 30b, and 30c may be located on the second substrate 20. The first color filter 30a may include a pigment or dye of a first color (e.g., green). The second color filter 30b may include a pigment or dye of a second color (e.g., red). The third color filter 30c may include a pigment or dye of a third color (e.g., blue).

A color conversion-transmission layer including a first color converter 40a, a second color converter 40b, and a transmitter 40c may be located on the color layer. The first color converter 40a, the second color converter 40b, and the transmitter 40c may covered by a barrier layer 180. A portion of the barrier layer 180 may be between the second light-shielding layer 22 and the first color converter 40a. Likewise, a portion of the barrier layer 180 may be between the second light-shielding layer 22 and the second color converter 40b. A portion of the barrier layer 180 may be between the second light-shielding layer 22 and the transmitter 40c. The barrier layer 180 may include an inorganic insulation material such as silicon nitride, silicon oxide, and/or silicon oxynitride.

The first color converter 40a may overlap the first color filter 30a, and may convert the blue light Lb incident on the first color converter 40a into the green light Lg. The first color converter 40a may include a first photosensitive polymer 1161 in which first quantum dots 1162 and first scattering particles 1163 may be dispersed, as shown in FIG. 1C.

The first quantum dots 1162 may be excited by the blue light Lb and may isotropically emit the green light Lg having a wavelength longer than that of the blue light Lb. The first photosensitive polymer 1161 may be an organic material through which light may be transmitted.

The first scattering particles 1163 may scatter the blue light Lb that may not be absorbed by the first quantum dots 1162 to excite more first quantum dots 1162, thereby improving color conversion efficiency. The first scattering particles 1163 may be, for example, titanium oxide ($TiO_2$) or metal particles. The first quantum dots 1162 may be selected from among group II-VI compounds, group III-V compounds, group IV-VI compounds, group IV elements, group IV compounds, and combinations thereof.

The second color converter 40b may overlap the second color filter 30b, and may convert the blue light Lb incident on the second color converter 40b into the red light Lr. The second color converter 40b may include a second photosensitive polymer 1151 in which second quantum dots 1152 and second scattering particles 1153 may be dispersed, as shown in FIG. 1C.

The second quantum dots 1152 may be excited by the blue light Lb, and may isotropically emit the red light Lr having a wavelength longer than that of the blue light Lb. The second photosensitive polymer 1151 may be an organic material through which light may be transmitted. The second scattering particles 1153 may scatter the blue light Lb that may not be absorbed by the second quantum dots 1152 to excite more second quantum dots 1152, thereby improving color conversion efficiency. The second scattering particles 1153 may be, for example, titanium oxide ($TiO_2$) or metal particles. The second quantum dots 1152 may be selected from among group II-VI compounds, group III-V compounds, group IV-VI compounds, group IV elements, group IV compounds, and combinations thereof. The second quantum dots 1152 may be the same material as the first quantum dots 1162. Sizes of the second quantum dots 1152 may be different from sizes of the first quantum dots 1162. In an embodiment, sizes of the second quantum dots 1152 may be greater than sizes of the first quantum dots 1162.

The transmitter 40c may transmit the blue light Lb therethrough. The transmitter 40c may include a third photosensitive polymer 1171 in which third scattering particles 1173 may be dispersed, as shown in FIG. 1C. The third photosensitive polymer 1171 may be an organic material through which light may be transmitted such as silicon resin or epoxy resin, and may be the same material as the first and second photosensitive polymers 1151 and 1161. The third scattering particles 1173 may scatter and emit the blue light Lb, and may be the same material as the first and second scattering particles 1153 and 1163.

The blue light Lb emitted from the light-emitting panel 1 may pass through the color conversion-transmission layer to be converted into light of a different color or to be transmitted without color conversion, and may pass through the color layer to improve color purity. For example, blue light emitted by the first organic light-emitting diode OLED1 of the light-emitting panel 1 may pass through a first color area of the color panel 2. While passing through the color panel 2, the blue light may be converted by the color panel 2 into green light and may be filtered. The first color area may have a stacked structure of the first color converter 40*a* and the first color filter 30*a*.

Blue light emitted by the second organic light-emitting diode OLED2 of the light-emitting panel 1 may pass through a second color area of the color panel 2. While passing through the color panel 2, the blue light may be converted by the color panel 2 into red light and may be filtered. The second color area may have a stacked structure of the second color converter 40*b* and the second color filter 30*b*.

Blue light emitted by the third organic light-emitting diode OLED3 of the light-emitting panel 1 may pass through a third color area of the color panel 2. While passing through the color panel 2, the blue light may be transmitted and filtered by the color panel 2. The third color area may have a stacked structure of the transmitter 40*c* and the third color filter 30*c*.

The display device having the above structure may be provided in an electronic apparatus including a mobile phone, a television, a billboard, a tablet PC, a laptop, a smart watch worn on a wrist, a smart band, or another suitable apparatus.

Figure 2:
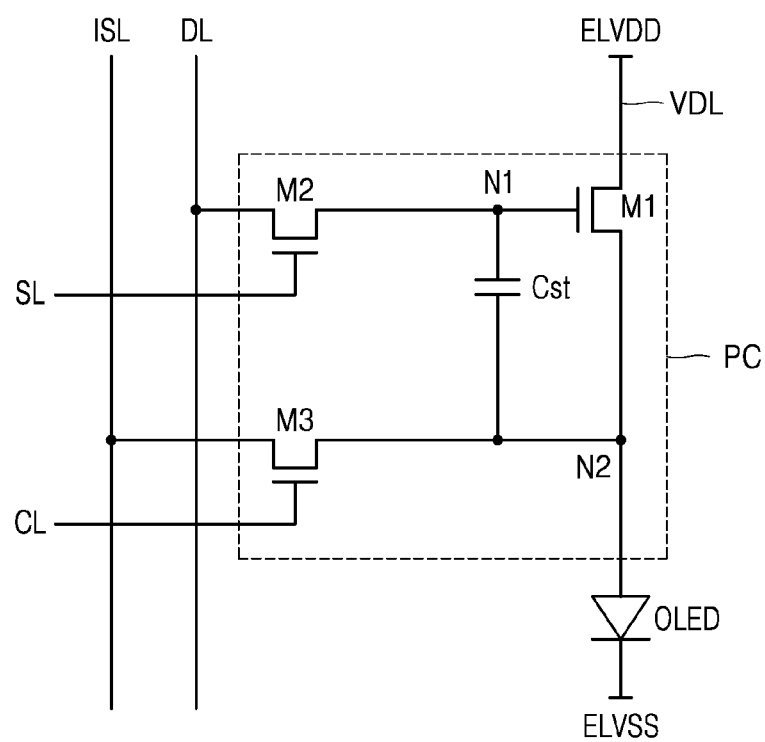
FIG. 2 is a schematic circuit diagram illustrating a light-emitting diode included in a light-emitting panel of a display device and a pixel circuit electrically connected to the light-emitting diode according to an embodiment of the disclosure.

FIG. 2 is a schematic circuit diagram illustrating a light-emitting diode included in a light-emitting panel of a display device and a pixel circuit electrically connected to the light-emitting diode according to an embodiment of the disclosure.

Referring to FIG. 2, a pixel electrode (e.g., an anode) of a light-emitting diode, e.g., an organic light-emitting diode OLED, may be electrically connected to a pixel circuit PC, and a counter electrode (e.g., a cathode) of the organic light-emitting diode OLED may be electrically connected to a common power supply voltage ELVSS. The organic light-emitting diode OLED may emit light at a luminance corresponding to the amount of current supplied from the pixel circuit PC.

The organic light-emitting diode OLED of FIG. 2 may correspond to each of the first through third organic light-emitting diodes OLED1, OLED2, and OLED3 of FIG. 1B, and the pixel circuit PC of FIG. 2 may correspond to each of the first through third pixel circuits PC1, PC2, and PC3 of FIG. 1B.

The pixel circuit PC may control the amount of current flowing from a driving power supply voltage ELVDD through the organic light-emitting diode OLED to the common power supply voltage ELVSS in response to a data signal. The pixel circuit PC may include a first transistor M1, a second transistor M2, a third transistor M3, and a storage capacitor Cst.

Each of the first transistor M1, the second transistor M2, and the third transistor M3 may be an oxide semiconductor thin-film transistor including a semiconductor layer formed of an oxide semiconductor, or may be a silicon semiconductor thin-film transistor including a semiconductor layer formed of polysilicon. A first electrode may be one of a source electrode and a drain electrode, and the second electrode may be the other of the source electrode and the drain electrode, according to a type of a transistor.

The first transistor M1 may be a driving transistor. A first electrode of the first transistor M1 may be electrically connected to a driving voltage line VDL that supplies a driving power supply voltage ELVDD, and a second electrode of the first transistor M1 may be electrically connected to the pixel electrode of the organic light-emitting diode OLED. A gate electrode of the first transistor M1 may be electrically connected to a first node N1. The first transistor M1 may control the amount of current flowing from the driving power supply voltage ELVDD through the organic light-emitting diode OLED in response to a voltage of the first node N1.

The second transistor M2 may be a switching transistor. A first electrode of the second transistor M2 may be electrically connected to a data line DL, and a second electrode of the second transistor M2 may be electrically connected to the first node N1. A gate electrode of the second transistor M2 may be electrically connected to a scan line SL. The second transistor M2 may be turned on in case that a scan signal may be applied to the scan line SL, to electrically connect the data line DL to the first node N1.

The third transistor M3 may be an initialization transistor and/or a sensing transistor. A first electrode of the third transistor M3 may be electrically connected to a second node N2, and a second electrode of the third transistor M3 may be electrically connected to an initialization-sensing line ISL. A gate electrode of the third transistor M3 may be electrically connected to a control line CL.

The third transistor M3 may be turned on in case that a control signal may be applied to the control line CL, to electrically connect the initialization-sensing line ISL to the second node N2. In some embodiments, the third transistor M3 may be turned on according to a signal received through the control line CL, to initialize the pixel electrode of the organic light-emitting diode OLED by using an initialization voltage from the initialization-sensing line ISL. In some embodiments, the third transistor M3 may be turned on in case that a control signal may be applied to the control line CL, to sense characteristic information of the organic light-emitting diode OLED. The third transistor M3 may have both a function of the initialization transistor and a function of the sensing transistor, or may have a function of any one of the initialization transistor and the sensing transistor. In some embodiments, in case that the third transistor M3 has a function of the initialization transistor, the initialization-sensing line ISL may be referred to as an initialization voltage line, and in case that the third transistor M3 has a function of the sensing transistor, the initialization-sensing line ISL may be referred to as a sensing line. An initialization operation and a sensing operation of the third transistor M3 may be performed individually or simultaneously. For convenience of explanation, the following will be described assuming that the third transistor M3 has both functions of the initialization transistor and the sensing transistor.

The storage capacitor Cst may be electrically connected between the first node N1 and the second node N2. For example, a first electrode of the storage capacitor Cst may be electrically connected to the gate electrode of the first transistor M1, and a second electrode of the storage capacitor Cst may be electrically connected to the pixel electrode of the organic light-emitting diode OLED.

Although the first transistor M1, the second transistor M2, and the third transistor M3 may be NMOS transistors in FIG. 2, the disclosure is not limited thereto. For example, at least one of the first transistor M1, the second transistor M2, or the third transistor M3 may be a PMOS transistor.

Although three transistors M1, M2, M3 are illustrated in FIG. 2, the disclosure is not limited thereto. The pixel circuit PC may include four or more transistors.

Figure 3:
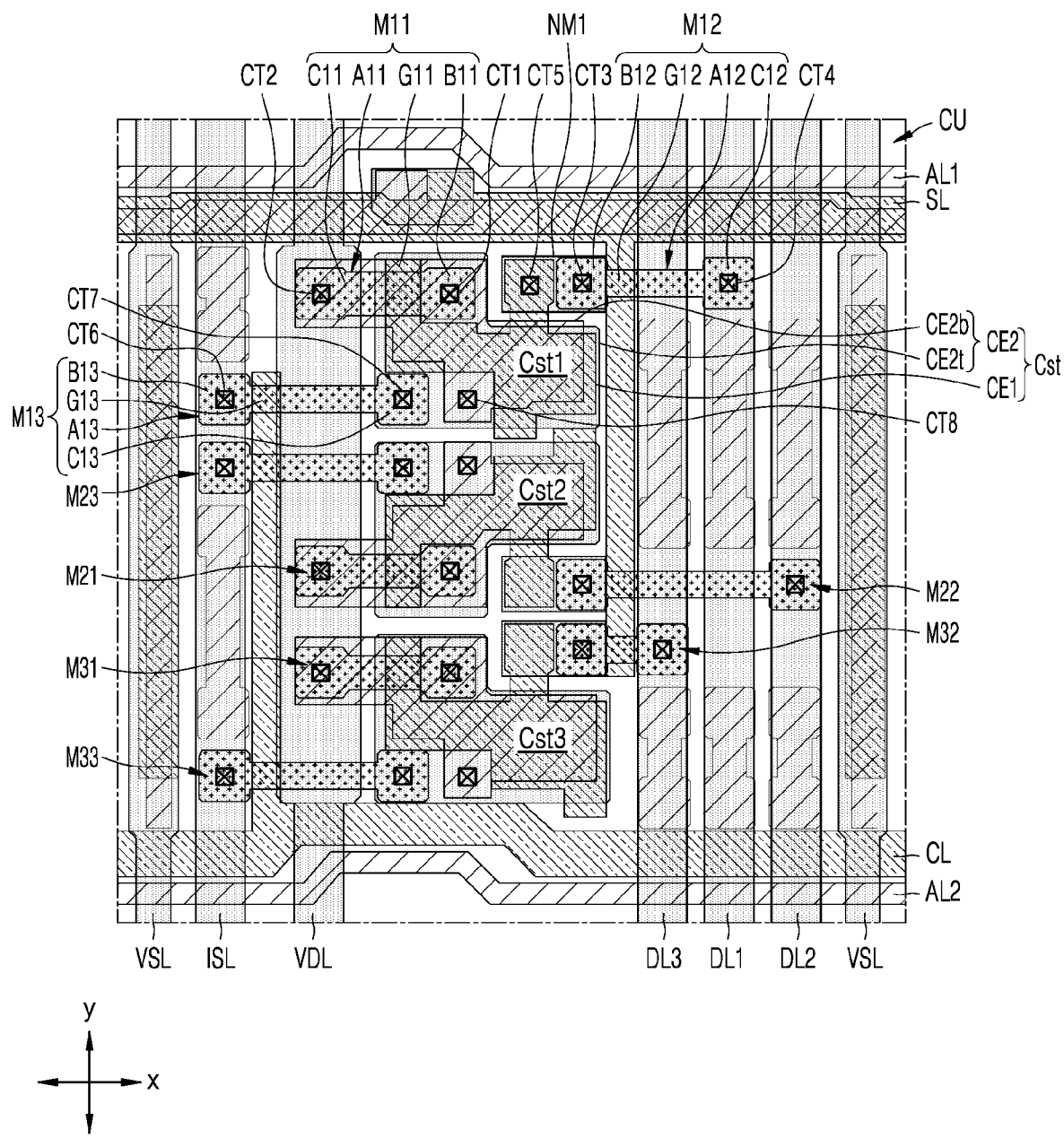
FIG. 3 is a schematic plan view illustrating pixel circuits of a light-emitting panel according to an embodiment of the disclosure.
Figure 4:
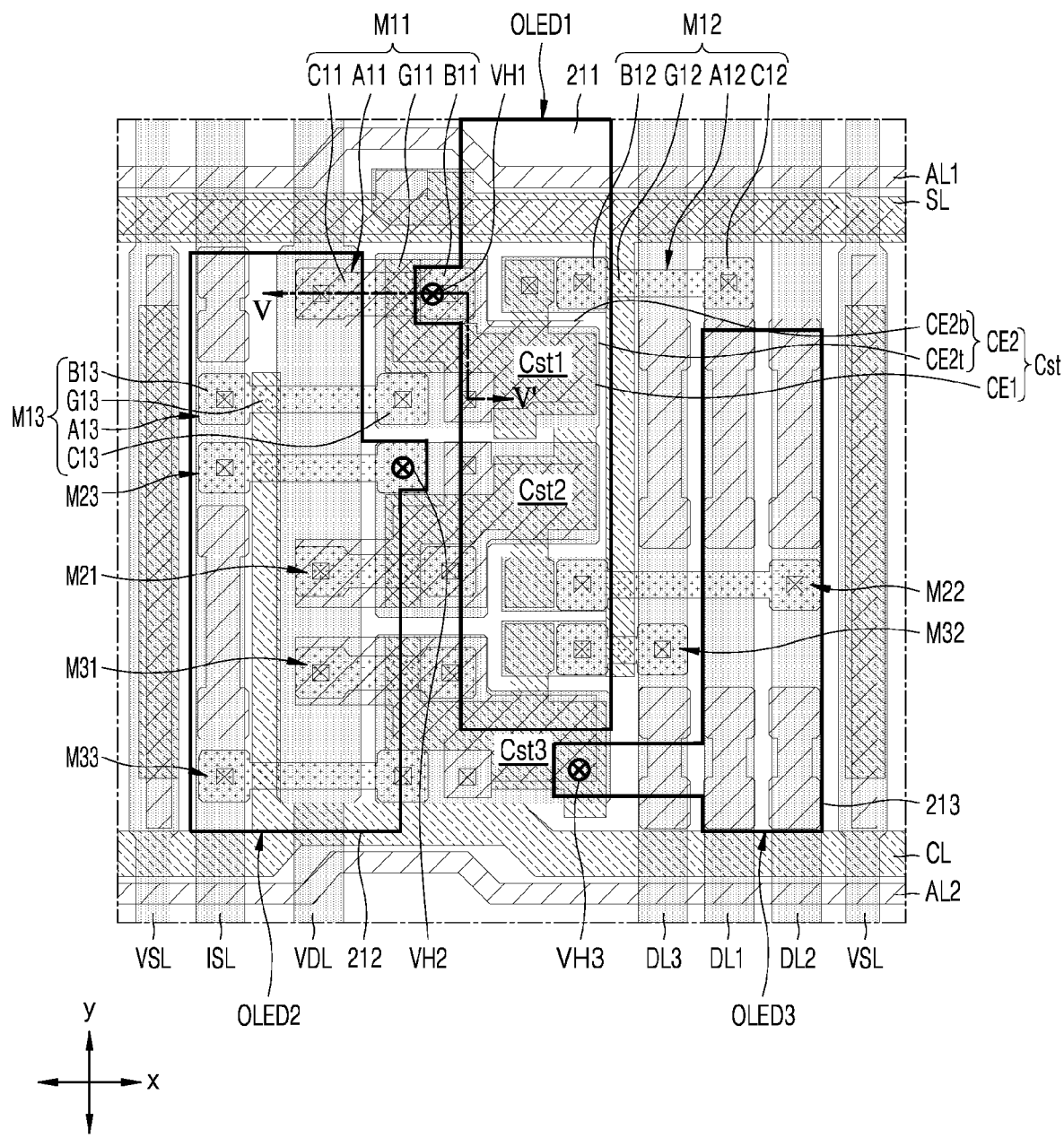
FIG. 4 is a schematic plan view illustrating organic light-emitting diodes electrically connected to the pixel circuits of FIG. 3.

FIG. 3 is a schematic plan view illustrating pixel circuits of a light-emitting panel according to an embodiment of the disclosure. FIG. 4 is a schematic plan view illustrating organic light-emitting diodes electrically connected to the pixel circuits of FIG. 3.

Referring to FIG. 3, the scan line SL and the control line CL extend in a first direction (e.g., an x-direction), and data lines, e.g., first through third data lines DL1, DL2, and DL3, may be located in a second direction (e.g., a y-direction) intersecting the first direction. The initialization-sensing line ISL, a driving voltage line VDL, and a common voltage line VSL may extend in the second direction.

In some embodiments, two adjacent common voltage lines VSL may be spaced apart from each other, and the first through third data lines DL1, DL2, and DL3, the initialization-sensing line ISL, and the driving voltage line VDL may be located between the two adjacent common voltage lines VSL. The initialization-sensing line ISL and the driving voltage line VDL may be adjacent to each other and may be located adjacent to one common voltage line VSL. The first through third data lines DL1, DL2, and DL3 may be adjacent to one another, and may be located adjacent to another common voltage line VSL. For example, the initialization-sensing line ISL and the driving voltage line VDL may be located at a side (e.g., a left side) of first through third storage capacitors Cst1, Cst2, and Cst3 which will be described below, and the first through third data lines DL1, DL2, and DL3 may be located at another side (e.g., a right side) of the first through third storage capacitors Cst1, Cst2, and Cst3, and thus, a space of a display panel may be efficiently used in this structure.

Auxiliary lines, e.g., first and second auxiliary lines AL1 and AL2, may extend in the first direction to intersect the common voltage line VSL and the driving voltage line VDL. The first auxiliary line AL1 and the second auxiliary line AL2 may be spaced apart from each other. For example, the first auxiliary line AL1 may be located adjacent to the scan line SL, and the second auxiliary line AL2 may be located adjacent to the control line CL. One of the first auxiliary line AL1 and the second auxiliary line AL2 may be electrically connected to the common voltage line VSL, and another of the first auxiliary line AL1 and the second auxiliary line AL2 may be electrically connected to the driving voltage line VDL.

Transistors and storage capacitors may be located between the scan line SL and the first through third data lines DL1, DL2, and DL3 intersecting each other. Each of the transistors and the storage capacitors may be electrically connected to a corresponding organic light-emitting diode, and in this regard, FIG. 4 illustrates the first through third organic light-emitting diodes OLED1, OLED2, and OLED3.

The first organic light-emitting diode OLED1 may be electrically connected to a first pixel circuit, and the first pixel circuit may include a first driving transistor M11, a first switching transistor M12, a first initialization-sensing transistor M13, and the first storage capacitor Cst1.

The second organic light-emitting diode OLED2 may be electrically connected to a second pixel circuit, and the second pixel circuit may include a second driving transistor M21, a second switching transistor M22, a second initialization-sensing transistor M23, and the second storage capacitor Cst2.

The third organic light-emitting diode OLED3 may be electrically connected to a third pixel circuit, and the third pixel electrode may include a third driving transistor M31, a third switching transistor M32, a third initialization-sensing transistor M33, and the third storage capacitor Cst3.

The first through third storage capacitors Cst1, Cst2, and Cst3 may be arranged in one direction, e.g., the second direction. The first storage capacitor Cst1 may be located closest to the scan line SL, the third storage capacitor Cst3 may be located farthest from the scan line SL (or closest to the control line CL), and the second storage capacitor Cst2 may be located between the first storage capacitor Cst1 and the third storage capacitor Cst3.

The first driving transistor M11 may include a first driving semiconductor layer A11 and a first driving gate electrode G11. The first driving semiconductor layer A11 may include a first high concentration impurity region B11 and a second high concentration impurity region Cl 1, and a first channel region may be provided between the high concentration impurity region B11 and the second high concentration impurity region C11. The first high concentration impurity region B11 and the second high concentration impurity region C11 may be regions doped with impurities at a concentration higher than that of the first channel region. The first driving gate electrode G11 may overlap the first channel region of the first driving semiconductor layer A11.

One of the first high concentration impurity region B11 and the second high concentration impurity region Cl 1 of the first driving semiconductor layer A11 may be electrically connected to the driving voltage line VDL, and another of the first high concentration impurity region B11 and the second high concentration impurity region C11 may be electrically connected to the first storage capacitor Cst1. For example, the first high concentration impurity region B11 may be electrically connected to a portion of a second electrode of the first storage capacitor Cst1 through a first contact hole CT1, and the second high concentration impurity region C11 may be electrically connected to the driving voltage line VDL through a second contact hole CT2. A portion of the second electrode of the first storage capacitor Cst1 and a portion of the driving voltage line VDL may respectively correspond to a first electrode and a second electrode of a driving transistor described with reference to FIG. 2.

The first switching transistor M12 may include a first switching semiconductor layer A12 and a first switching gate electrode G12. The first switching semiconductor layer A12 may include a first high concentration impurity region B12 and a second high concentration impurity region C12, and a second channel region may be provided between the first high concentration impurity region B12 and the second high concentration impurity region C12. The first switching gate electrode G12 may overlap the second channel region of the first switching semiconductor layer A12. The first switching gate electrode G12 may correspond to a portion of the scan line SL.

The scan line SL may include gate electrodes of the first through third switching transistors M12, M22, and M32. For example, the scan line SL may include a first branch SL-B (see FIG. 7) in the second direction, and portions of the first branch SL-B may correspond to the gate electrodes of the first through third switching transistors M12, M22, and M32. The first branch SL-B may extend between a group of the first through third storage capacitors Cst1, Cst2, and Cst3 and a group of the first through third data lines DL1, DL2, and DL3.

One of the first high concentration impurity region B12 and the second high concentration impurity region C12 of the first switching semiconductor layer A12 may be electrically connected to the first data line DL1, and another of the first high concentration impurity region B12 and the second high concentration impurity region C12 may be electrically connected to the first storage capacitor Cst1. For example, the first high concentration impurity region B12 may be electrically connected to a first connection metal NM1 through a third contact hole CT3, the first connection metal NM1 may be electrically connected to a first electrode of the first storage capacitor Cst1 through a fifth contact hole CT5, and thus the first high concentration impurity region B12 may be electrically connected to the first storage capacitor Cst1 via the first connection metal NM1. The second high concentration impurity region C12 may be electrically connected to the first data line DL1 through a fourth contact hole CT4.

The first initialization-sensing transistor M13 may include a first initialization-sensing semiconductor layer A13 and a first initialization-sensing gate electrode G13. The first initialization-sensing semiconductor layer A13 may include a first high concentration impurity region B13 and a second high concentration impurity region C13, and a third channel region may be provided between the first high concentration impurity region B13 and the second high concentration impurity region C13. The first initialization-sensing gate electrode G13 may overlap the third channel region of the first initialization-sensing semiconductor layer A13.

The control line CL may include gate electrodes of the first through third initialization-sensing transistors M13, M23, and M33. For example, the control line CL may include a second branch CL-B (see FIG. 7) in the second direction, and portions of the second branch CL-B may correspond to the gate electrodes of the first through third initialization-sensing transistors M13, M23, and M33. The second branch CL-B may extend between the driving voltage line VDL and the initialization-sensing line ISL.

One of the first high concentration impurity region B13 and the second high concentration impurity region C13 of the first initialization-sensing semiconductor layer A13 may be electrically connected to the initialization-sensing line ISL, and another of the first high concentration impurity region B13 and the second high concentration impurity region C13 may be electrically connected to the first storage capacitor Cst1. For example, the first high concentration impurity region B13 may be electrically connected to the initialization-sensing line ISL through a sixth contact hole CT6, and the second high concentration impurity region C13 may be electrically connected to the second electrode of the first storage capacitor Cst1 through a seventh contact hole CT7.

The first storage capacitor Cst1 may include at least two electrodes. In an embodiment, the first storage capacitor Cst1 may include a first electrode CE1 and a second electrode CE2, and the second electrode CE2 may include a first sub-electrode CE2$b$ under the first electrode CE1 and a second sub-electrode CE2$t$ over the first electrode CE1. The first sub-electrode CE2$b$ and the second sub-electrode CE2$t$ may be electrically connected to each other through an eighth contact hole CTB.

The first organic light-emitting diode OLED1 may be electrically connected to the first pixel circuit through a first via hole VH1 as shown in FIG. 4. For example, a first pixel electrode 211 of the first organic light-emitting diode OLED1 may be electrically connected to the second sub-electrode CE2$t$ through the first via hole VH1.

The second driving transistor M21, the second switching transistor M22, and the second initialization-sensing transistor M23 of the second pixel circuit may have the same structure as that of the first driving transistor M11, the first switching transistor M12, and the first initialization-sensing transistor M13. Likewise, the second storage capacitor Cst2 may have the same structure as that of the first storage capacitor Cst1, and the second organic light-emitting diode OELD2 may be electrically connected to the second pixel circuit through a second via hole VH2 as shown in FIG. 4. For example, a second pixel electrode 212 of the second organic light-emitting diode OLED2 may be electrically connected to a second upper electrode of the second storage capacitor Cst2 through the second via hole VH2.

Likewise, the third driving transistor M31, the third switching transistor M32, and the third initialization-sensing transistor M33 of the third pixel circuit may have the same structure as that of the first driving transistor M11, the second switching transistor M12, and the first initialization-sensing transistor M13. Likewise, the third storage capacitor Cst3 may have the same structure as that of the first storage capacitor Cst1, and the third organic light-emitting diode OLED3 may be electrically connected to the third pixel circuit through a third via hole VH3 as shown in FIG. 4. For example, a third pixel electrode 213 of the third organic light-emitting diode OLED3 may be electrically connected to a second upper electrode of the third storage capacitor Cst3 through the third via hole VH3.

The first organic light-emitting diode OLED1, the second organic light-emitting diode OELD2, and the third organic light-emitting diode OLED3 may be arranged in the first direction (e.g., the x-direction). The first organic light-emitting diode OLED1 may be located between the second organic light-emitting diode OLED2 and the third organic light-emitting diode OLED3, and may overlap a part of the first through third storage capacitors Cst1, Cst2, and Cst3. The second organic light-emitting diode OLED2 may overlap a part of the driving voltage line VDL and/or the initialization-sensing line ISL. The third organic light-emitting diode OLED3 may overlap a part of the first through third data lines DL1, DL2, and DL3. For example, the third organic light-emitting diode OLED3 may overlap portions of the first and second data lines DL1 and DL2 as described in FIG. 4.

Figure 5:
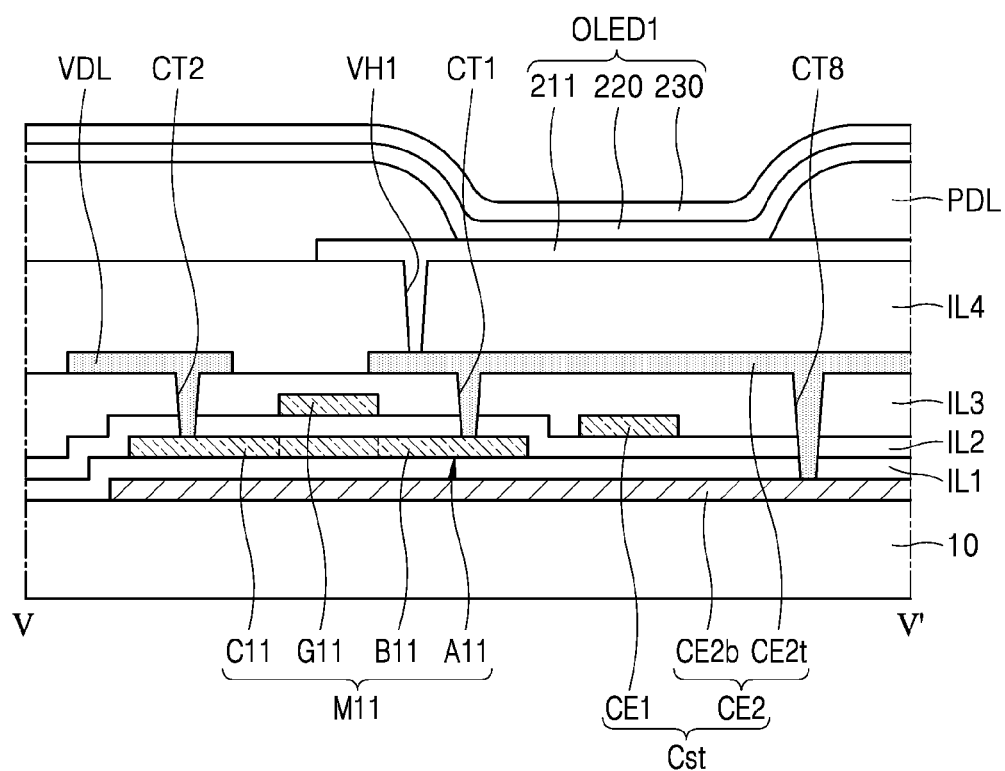
FIG. 5 is a schematic cross-sectional view taken along line V-V of FIG. 4.
Figure 6:
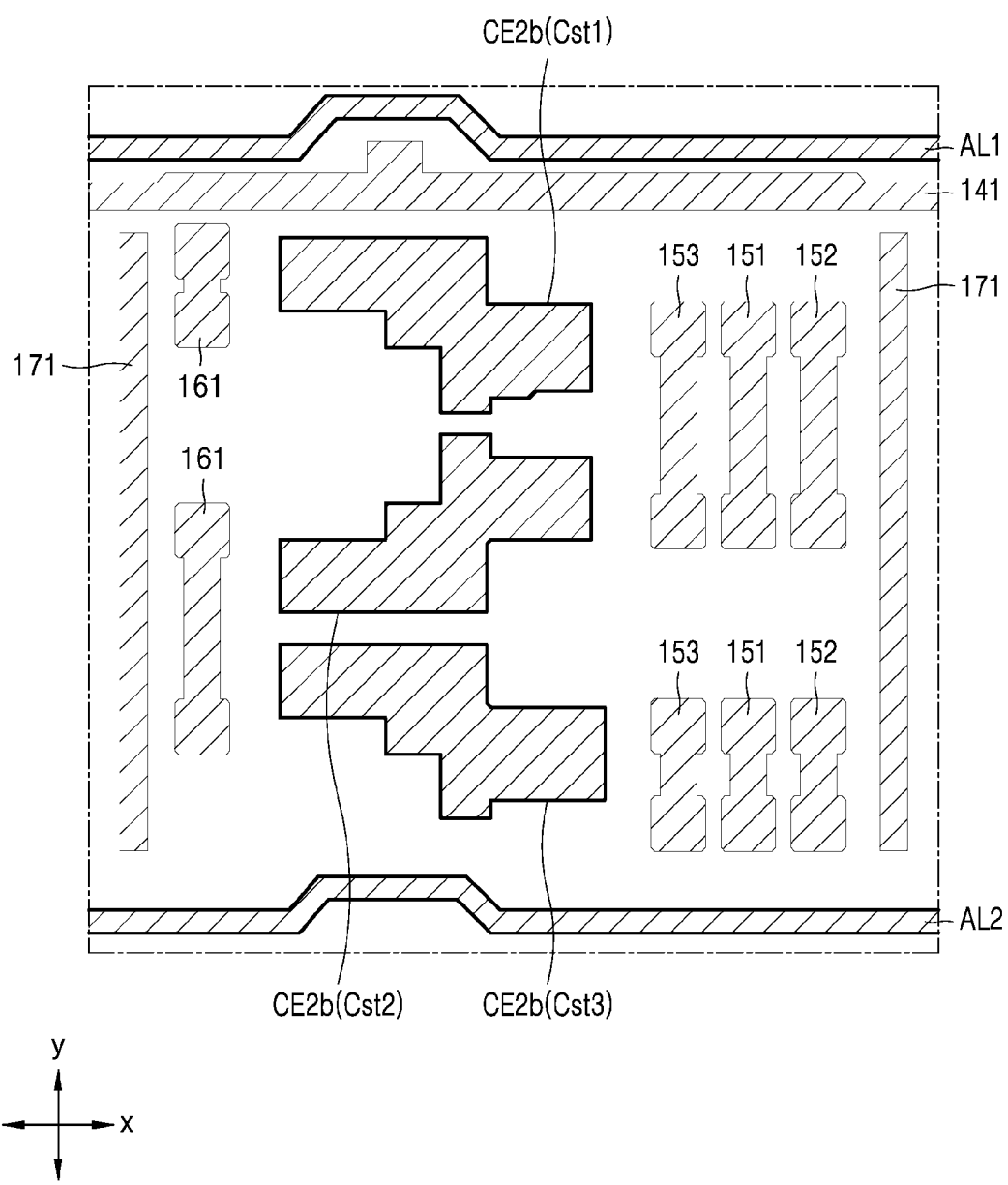
FIGS. 6 through 8 are schematic plan views each illustrating a process of manufacturing a pixel circuit of FIG. 3.
Figure 7:
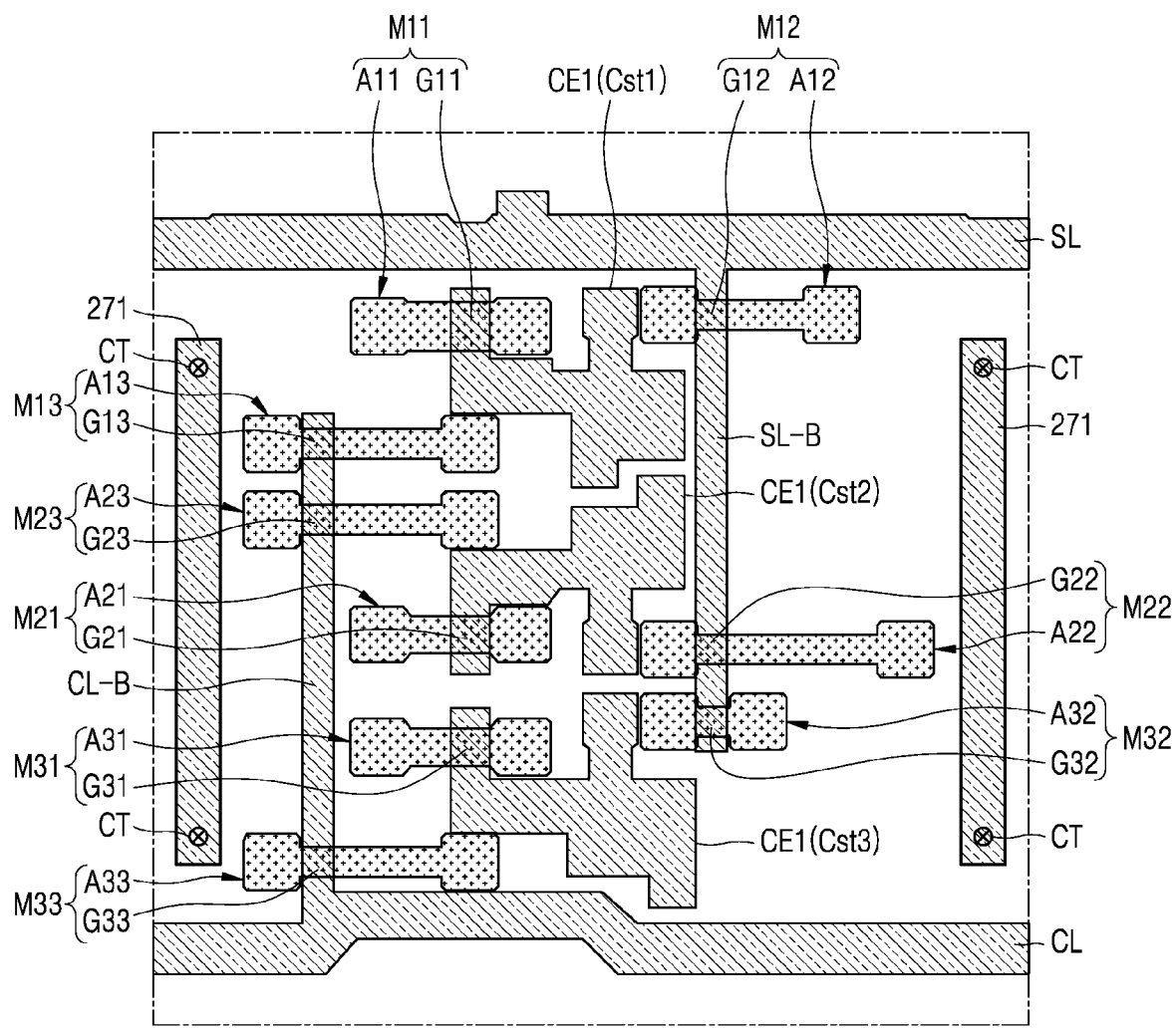
Figure 8:
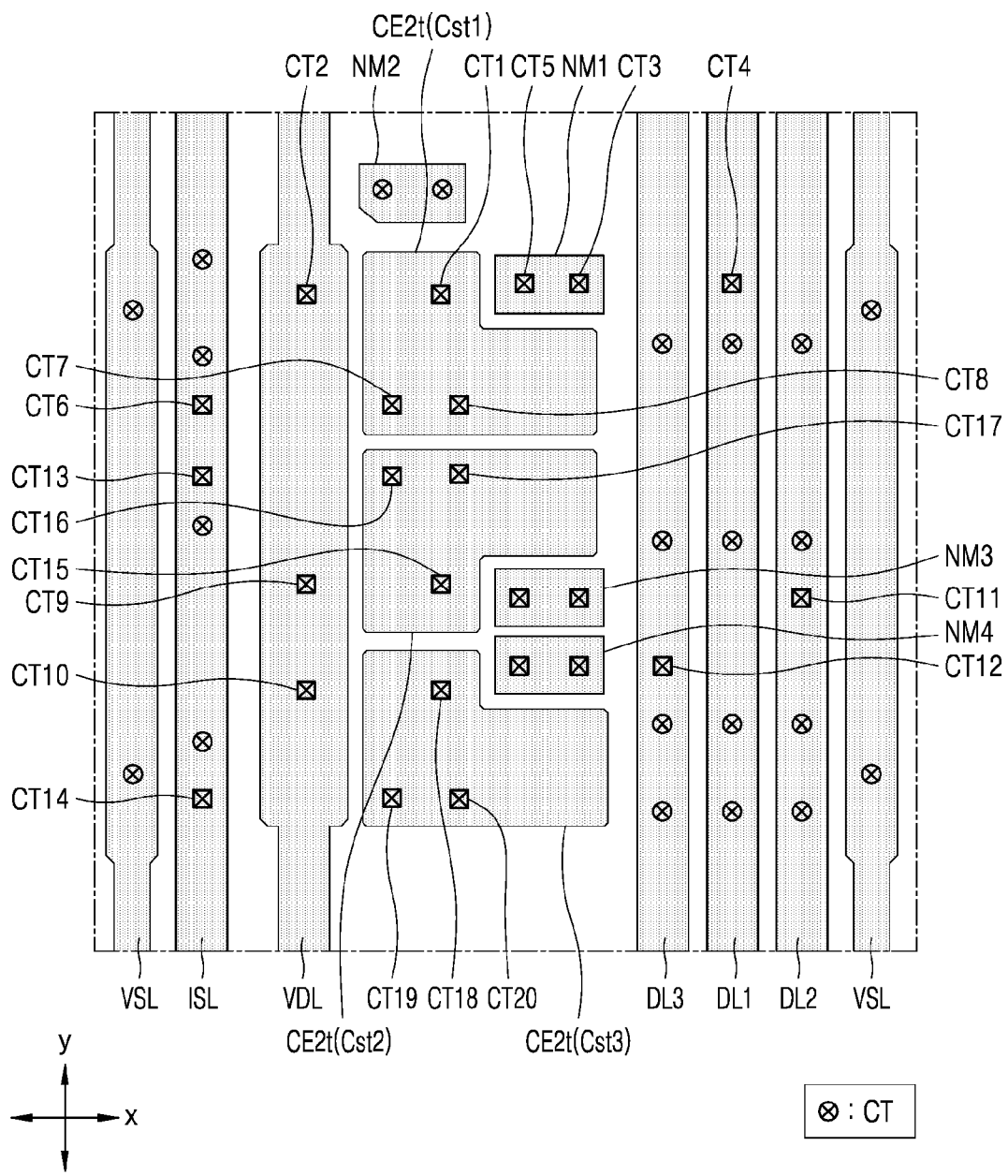

FIG. 5 is a schematic cross-sectional view taken along line V-V of FIG. 4. FIGS. 6 through 8 are schematic plan views each illustrating a process of manufacturing a pixel circuit of FIG. 3.

Referring to FIG. 5, first through third pixel circuits may be located on the first substrate 10. The first substrate 10 may include a glass material, a resin material, or a combination thereof. The glass material may include transparent glass having $SiO_2$ as a main component. The resin material may include a polymer resin such as polyethersulfone, polyacrylate, polyether imide, polyethylene naphthalate, polyethylene terephthalate, polyphenylene sulfide, polyarylate, polyimide, polycarbonate, cellulose triacetate, cellulose acetate propionate, or a combination thereof.

Referring to FIGS. 5 and 6, a layer including the first sub-electrode CE2$b$ of the first storage capacitor Cst1 may be formed on the first substrate 10. The first sub-electrode CE2*b* may be formed by forming a first conductive material layer and patterning the first conductive material layer, and elements illustrated in FIG. 6 may also be formed in a process of forming the first sub-electrode CE2*b*. For example, the first and second auxiliary lines AL1 and AL2, and the first sub-electrodes CE2*b* respectively corresponding to the first through third storage capacitors Cst1, Cst2, and Cst3 may be formed together on the first substrate 10.

In some embodiments, when the first and second auxiliary lines AL1 and AL2 and the first sub-electrodes CE2*b* may be formed, conductive layers may also be formed. The conductive layers may include a first conductive layer 141 extending in the first direction, second through fourth conductive layers 151, 152, and 153 extending in the second direction, a fifth conductive layer 161 extending in the second direction, and a sixth conductive layer 171 extending in the second direction.

Each of the first and second auxiliary lines AL1 and AL2, the first sub-electrodes CE2*b*, and the conductive layers may include molybdenum (Mo), copper (Cu), titanium (Ti), or a combination thereof, and may have a single or multi-layer structure including the above material. The first and second auxiliary lines AL1 and AL2, the second sub-electrodes CE2*b*, and the conductive layers may be covered by a first insulating layer IL1. The first insulating layer IL1 may include an inorganic insulating material such as silicon nitride, silicon oxide, and/or silicon oxynitride, and/or an organic insulating material.

Referring to FIGS. 5 and 7, a layer including the first driving semiconductor layer A11 of the first driving transistor M11 may be formed on the first insulating layer IL1. The first driving semiconductor layer A11 may be formed by forming a semiconductor material layer and patterning the semiconductor material layer, and second and third driving semiconductor layers A21 and A31, first through third switching semiconductor layers A12, A22, and A32 and first through third initialization-sensing semiconductor layers A13, A23, and A33 may also be formed in a process of forming the first driving semiconductor layer A11.

The first through third driving semiconductor layers A11, A21, and A31 may be sequentially arranged in the second direction, and may have substantially the same length. The first through third initialization-sensing semiconductor layers A13, A23, and A33 may be sequentially arranged in the second direction, and may have substantially the same length.

The first through third switching semiconductor layers A12, A22, and A32 may be sequentially arranged in the second direction, and may have different lengths. For example, a length of the second switching semiconductor layer A22 located in the middle may be greater than a length of the first switching semiconductor layer A12 adjacent to the scan line SL and a length of the third switching semiconductor layer A32 farthest from the scan line SL. A length of the first switching semiconductor layer A12 may be greater than a length of the third switching semiconductor layer A32.

Each of the first through third driving semiconductor layers A11, A21, and A31, the first through third switching semiconductor layers A12, A22, and A32, and the first through third initialization-sensing semiconductor layers A13, A23, and A33 may include polysilicon or an oxide semiconductor.

A second insulating layer IL2 may be formed. The second insulating layer IL2 may include an inorganic insulating material such as silicon nitride, silicon oxide, and/or silicon oxynitride, and/or an organic insulating material.

A layer including the first driving gate electrode G11 of the first driving transistor M11 and the first electrode CE1 of the first storage capacitor Cst1 may be formed on the second insulating layer IL2. The first driving gate electrode G11 and the first electrode CE1 of the first storage capacitor Cst1 may be integrally formed with each other.

The first driving gate electrode G11 and the first electrode CE1 may be formed by forming a second conductive material layer and patterning the second conductive material layer. First through third driving gate electrodes G11, G21, and G31, the first electrodes CE1 of the second and third storage capacitors Cst2 and Cst3, the scan line SL, and the control line CL may also be formed in a process of forming and patterning the second conductive material layer.

The second driving gate electrode G21 and the first electrode CE1 of the second storage capacitor Cst2 may be integrally formed with each other, and the third driving gate electrode G31 and the first electrode CE1 of the third storage capacitor Cst3 may be integrally formed with each other.

The scan line SL and the control line CL may respectively include the first branch SL-B and the second branch CL-B. Portions of the first branch SL-B may correspond to first through third switching gate electrodes G12, G22, and G32 of the first through third switching transistors M12, M22, and M32, and portions of the second branch CL-B may correspond to first through third initialization-sensing gate electrodes G13, G23, and G33 of the first through third initialization-sensing transistors M13, M23, and M33.

In some embodiments, when the second conductive material layer may be formed and may be patterned, a seventh conductive layer 271 may be formed. The seventh conductive layer 271 may be electrically connected to the sixth conductive layer 171 through a contact hole CT.

Each of the first through third driving gate electrodes G11, G21, and G31, the first scan line SL, the control line CL, and the first electrodes CE1 may include copper (Cu), titanium (Ti), or a combination thereof, and may have a single or multi-layer structure including the above material. The first through third driving gate electrodes G11, G21, and G31, the first scan line SL, the control line CL, and the first electrodes CE1 may be covered by a third insulating layer IL3. The third insulating layer IL3 may include an inorganic insulating material such as silicon nitride, silicon oxide, and/or silicon oxynitride, and/or an organic insulating material.

Referring to FIGS. 5 and 8, a layer including the driving voltage line VDL and the second sub-electrode CE2*t* of the first storage capacitor Cst1 may be formed. Each of the driving voltage line VDL and the second sub-electrode CE2*t* may be formed by forming a third conductive material layer and patterning the third conductive material layer. Elements illustrated in FIG. 8 may also be formed in a process of forming the third conductive material layer and patterning the third conductive material layer.

The second sub-electrodes CE2*t* of the first through third storage capacitors Cst1, Cst2, and Cst3, the first through third data lines DL1, DL2, and DL3, the initialization-sensing line ISL, the driving voltage line VDL, the common voltage line VSL, and first through fourth connection metals NM1, NM2, NM3, and NM4 may be formed together.

Each of the second sub-electrodes CE2*t* of the first through third storage capacitors Cst1, Cst2, and Cst3, the first through third data lines DL1, DL2, and DL3, the initialization-sensing line ISL, the driving voltage line VDL, the common voltage line VSL, and the first through fourth connection metals NM1, NM2, NM3, and NM4 may include copper (Cu), titanium (Ti), or a combination thereof, and may have a single or multi-layer structure including the above material.

Referring to FIGS. 5 through 8, the driving voltage line VDL may be electrically connected to the first driving semiconductor layer A11 of the first driving transistor M11 through the second contact hole CT2, may be electrically connected to the second driving semiconductor layer A21 of the second driving transistor M21 through a ninth contact hole CT9, and may be electrically connected to the third driving semiconductor layer A31 of the third driving transistor M31 through a tenth contact hole CT10.

The first data line DL1 may be electrically connected to the first switching semiconductor layer A12 of the first switching transistor M12 through the fourth contact hole CT4. The second data line DL2 may be electrically connected to the second switching semiconductor layer A22 of the second switching transistor M22 through an $11^{th}$ contact hole CT11. The third data line DL3 may be electrically connected to the third switching semiconductor layer A32 of the third switching transistor M32 through a $12^{th}$ contact hole CT12.

The initialization-sensing line ISL may be electrically connected to the first initialization-sensing semiconductor layer A13 of the first initialization-sensing transistor M13 through the sixth contact hole CT6, may be electrically connected to the second initialization-sensing semiconductor layer A23 of the second initialization-sensing transistor M23 through a $13^{th}$ contact hole CT13, and may be electrically connected to the third initialization-sensing semiconductor layer A33 of the third initialization-sensing transistor M33 through a $14^{th}$ contact hole CT14.

The second sub-electrode CE2t of the first storage capacitor Cst1 may be electrically connected to the first driving semiconductor layer A11 of the first driving transistor M11 through the first contact hole CT1, and may be electrically connected to the first initialization-sensing semiconductor layer A13 of the first initialization-sensing transistor M13 through the seventh contact hole CT7. The second sub-electrode CE2t of the first storage capacitor Cst1 may be electrically connected to the first sub-electrode CE2b of the first storage capacitor Cst1 through the eighth contact hole CT8.

Likewise, the second sub-electrode CE2t of the second storage capacitor Cst2 may be electrically connected to the second driving semiconductor layer A21 of the second driving transistor M21 through a $15^{th}$ contact hole CT15, and may be electrically connected to the second initialization-sensing semiconductor layer A23 of the second initialization-sensing transistor M23 through a $16^{th}$ contact hole CT16. The second sub-electrode CE2t of the second storage capacitor Cst2 may be electrically connected to the first sub-electrode CE2b of the second storage capacitor Cst2 through a $17^{th}$ contact hole CT17.

The second sub-electrode CE2t of the third storage capacitor Cst3 may be electrically connected to the third driving semiconductor layer A31 of the third driving transistor M31 through an $18^{th}$ contact hole CT18, and may be electrically connected to the third initialization-sensing semiconductor layer A33 of the third initialization-sensing transistor M33 through a $19^{th}$ contact hole CT19. The second sub-electrode CE2t of the third storage capacitor Cst3 may be electrically connected to the first sub-electrode CE2b of the third storage capacitor Cst3 through a $20^{th}$ contact hole CT20.

The first connection metal NM1 may electrically connect the first switching semiconductor layer A12 and the first driving gate electrode G11 through contact holes. Likewise, each of the third connection metal NM3 and the fourth connection metal NM4 may connect the second switching semiconductor layer A22 and the second driving gate electrode G21 or may connect the third switching semiconductor layer A32 and the third driving gate electrode G31 through contact holes.

The second connection metal NM2 may connect the scan line SL to the first conductive layer 141 (see FIG. 6) through contact holes, and thus, may reduce the resistance of the scan line SL and may prevent a voltage drop of the scan line SL through this connection structure.

Each of the first through third data lines DL1, DL2, and DL3, the initialization-sensing line ISL, and the common voltage line VSL may be electrically connected to a corresponding conductive layer from among conductive layers of FIG. 6 (e.g., the second through sixth conductive layers 151, 152, 153, 161, and 171) through contact holes, thereby reducing resistance.

A fourth insulating layer IL4 may be formed as shown in FIG. 5. The fourth insulating layer IL4 may include an organic insulating material including polyimide. A first pixel electrode 211 may be electrically connected to the second sub-electrode CE2t through the first via hole VH1 of the fourth insulating layer IL4.

Referring to FIGS. 4 and 5, a pixel-defining film PDL may be formed on the first pixel electrode 211. The pixel-defining film PDL may have an opening overlapping the first pixel electrode 211. An emission layer 220 and a counter electrode 230 may be sequentially stacked on each other on the first pixel electrode 211. The first pixel electrode 211, the emission layer 220, and the counter electrode 230 may constitute the first organic light-emitting diode OLED1.

A structure of the first organic light-emitting diode OLED1 of FIG. 5 may be the same as that of each of the second and third organic light-emitting diodes OELD2 and OLED3 of FIG. 4. For example, the second organic light-emitting diode OLED2 may have a stacked structure of the second pixel electrode 212, the emission layer 220 and the counter electrode 230, and the third organic light-emitting diode OLED3 may have a stacked structure of the third pixel electrode 213, the emission layer 220, and the counter electrode 230.

The emission layer 220 may be integrally formed with light-emitting diodes, like the counter electrode 230. The emission layer 220 may include a high molecular weight organic material or a low molecular weight organic material that emits blue light.

Figure 9:
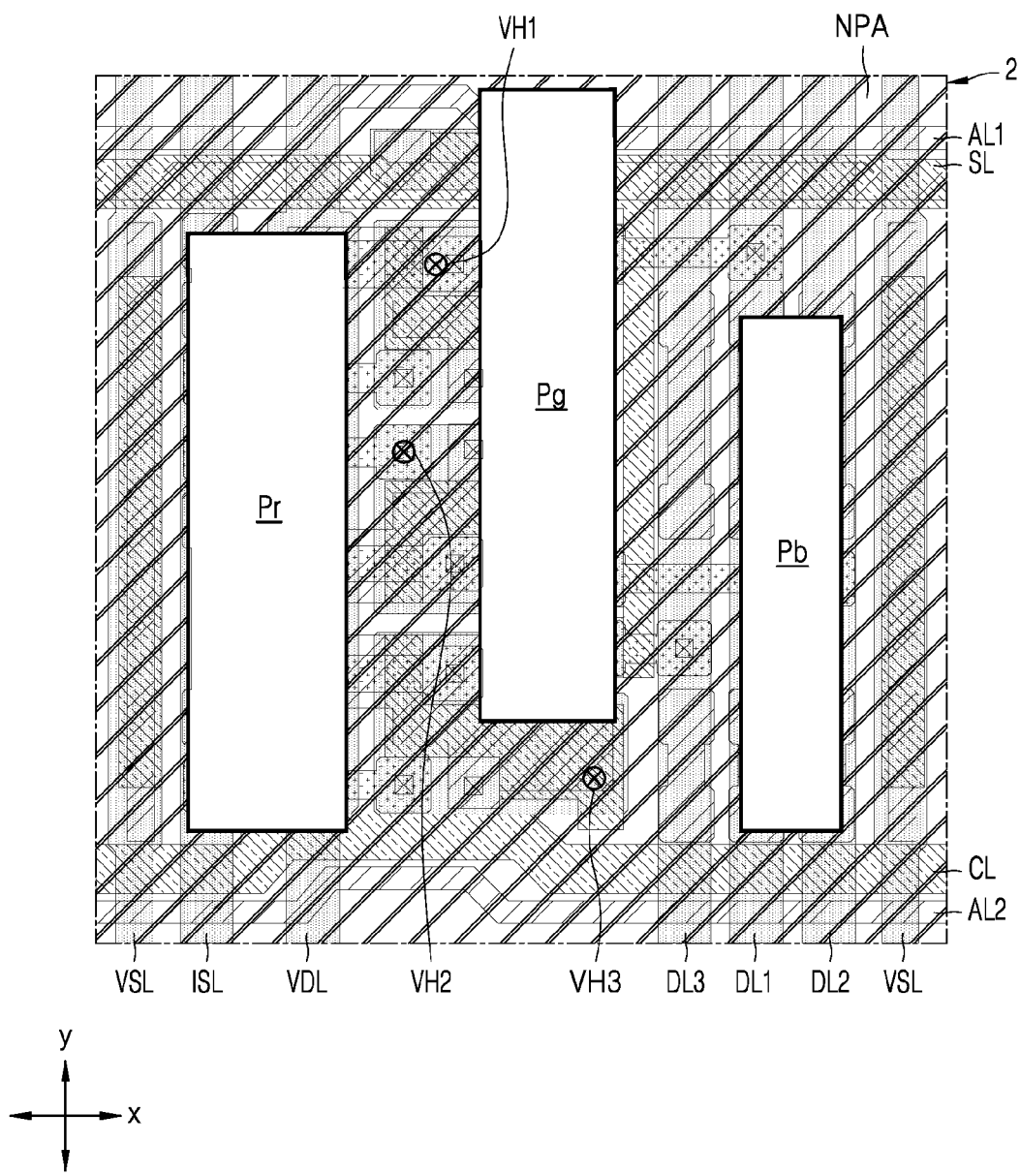
FIG. 9 is a schematic plan view illustrating that a color panel may be located on a light-emitting panel according to an embodiment of the disclosure.

FIG. 9 is a schematic plan view illustrating that a color panel may be located on a light-emitting panel according to an embodiment of the disclosure.

In an embodiment, FIG. 9 illustrates that the color panel 2 may be located on the first through third organic light-emitting diodes OLED1, OLED2, and OLED3 of FIG. 4. A detailed structure of the color panel 2 may be the same as that described with reference to FIGS. 1B and 1C.

Blue light emitted by the first organic light-emitting diode OLED1 may pass through a stacked structure of a first color converter and a first color filter to be converted into green light, and the green pixel Pg may be formed in an area where a stacked structure of the first organic light-emitting diode OLED1, the first color converter, and the first color filter may be located as shown in FIG. 9.

Blue light emitted by the second organic light-emitting diode OLED2 may pass through a stacked structure of a second color converter and a second color filter to be converted into red light, and the red pixel Pr may be formed in an area where a stacked structure of the second organic light-emitting diode OLED2, the second color converter, and the second color filter may be located as shown in FIG. 9.

Blue light emitted by the third organic light-emitting diode OLED3 may pass through a stacked structure of a transmitter and a third color filter to be converted into red light, and the blue pixel Pb may be formed in an area where a stacked structure of the third organic light-emitting diode OLED3, the transmitter, and the third color filter may be located as shown in FIG. 9.

The green pixel Pg may overlap parts of first through third storage capacitors, the red pixel Pr may overlap a part of a driving voltage line, and the blue pixel Pb may overlap parts of first through third data lines.

Each of the green pixel Pg, the red pixel Pr, and the blue pixel Pb may be surrounded by the non-pixel area NPA, and a first light-shielding layer and/or a second light-shielding layer may be located in the non-pixel area NPA as described above. Each of the first through third via holes VH1, VH2, and VH3 of FIG. 9 may overlap the non-pixel area NPA.

A display device according to embodiments of the disclosure may minimize parasitic capacitance and may improve display quality through a structure described with reference to FIGS. 3 through 9.

In detail, referring to FIG. 2, first parasitic capacitance may occur between the scan line SL and the first node N1, and second parasitic capacitance may occur between the scan line SL and the second node N2. Because parasitic capacitance may reduce the image quality of the display device, appropriate control may be required, and in case that the first parasitic capacitance and the second parasitic capacitance may be similar to each other, display quality deterioration due to the scan line SL may be minimized.

In some embodiments, the first node N1 (see FIG. 2) may include the first through third driving gate electrodes M11, M21, and M31 and/or first electrodes of the first through third storage capacitors Cst, Cst2, and Cst3 as shown in FIG. 3. The second node N2 (see FIG. 2) may include the first through third pixel electrodes 211, 212, and 213, second upper electrodes of the first through third storage capacitors Cst1, Cst2, and Cst3, and/or second lower electrodes as shown in FIG. 3.

The display device according to an embodiment of the disclosure may minimize a difference between the first parasitic capacitance and the second parasitic capacitance in an area (hereinafter, referred to as a first area) where the first storage capacitor Cst1 may be located through a structure described with reference to FIGS. 3 through 8. Also, as shown in FIGS. 4 and 9, because the first organic light-emitting diode OLED1 electrically connected to a pixel circuit located in the first area may correspond to a green pixel having relatively excellent visibility, the display device may provide a high-quality image.

Other factors affecting the image quality of the display device may include parasitic capacitance (hereinafter, referred to as third parasitic capacitance) between a data line and neighboring elements. According to embodiments of the disclosure, the third data line DL3 (electrically connected to a third organic light-emitting diode corresponding to a blue pixel) having a small difference between a data voltage for representing white and a data voltage for representing black from among the first through third data lines DL1, DL2, and DL3 may be located closest to the first through third storage capacitors Cst1, Cst2, and Cst3. The second data line DL2 (electrically connected to a second organic light-emitting diode corresponding to a red pixel) having a relatively large difference between a data voltage for representing white and a data voltage for representing black may be located farthest from the first through third storage capacitors Cst1, Cst2, and Cst3. In this structure, display quality deterioration due to the third parasitic capacitance may be minimized.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
    a light-emitting panel that includes a first light-emitting diode, a second light-emitting diode, a third light-emitting diode, and transistors; and
    a color panel disposed on the light-emitting panel, the color panel comprising a first color area, a second color area, a third color area, and a light-shielding area, the first, second, and third color areas including different colors, wherein
    the light-emitting panel further comprises:
        a scan line extending in a first direction;
        data lines extending in a second direction intersecting the first direction; and
        storage capacitors disposed adjacent to one another in the second direction, the storage capacitors including a first storage capacitor for the first light-emitting diode disposed adjacent to the scan line, a second storage capacitor for the second light-emitting diode disposed adjacent to the first storage capacitor in the second direction, and a third storage capacitor for the third light-emitting diode disposed adjacent to the second storage capacitor in the second direction, the first, second, and third storage capacitors being arranged along a first imaginary line parallel to the second direction in a plan view; and
        a driving voltage line disposed at a first side of the first imaginary line,
    the data lines includes a first data line for the first light-emitting diode, a second data line for the second light-emitting diode, and a third data line for the third light-emitting diode,
    the first, second, and third data lines are disposed at a second side of the first imaginary line, and the second side is opposite to the first side with respect to the first imaginary line, and
    the first, second, and third storage capacitors are disposed adjacent to one another in the second direction such that no scan line traverses between any two adjacent storage capacitors among the first, second, and third storage capacitors, wherein
    the first light-emitting diode overlaps multiple storage capacitors in plan view.

2. The display device of claim 1, wherein the transistors comprise a first driving transistor electrically connected to the first storage capacitor.

3. The display device of claim 2, wherein the first storage capacitor comprises:
    a first electrode electrically connected to a gate electrode of the first driving transistor; and a second electrode overlapping the first electrode, the second electrode comprising:
a first sub-electrode disposed under the first electrode; and
a second sub-electrode disposed over the first electrode and electrically connected to the first sub-electrode.

4. The display device of claim 1, wherein the first light-emitting diode comprises a first pixel electrode electrically connected to the first storage capacitor.

5. The display device of claim 4, wherein the first pixel electrode overlaps the first storage capacitor.

6. The display device of claim 4, wherein the first color area of the color panel comprises:
a first color converter overlapping the first light-emitting diode, the first color converter comprising quantum dots for converting incident light into green light; and
a green color filter overlapping the first color converter.

7. The display device of claim 1, wherein
the first light-emitting diode, the second light-emitting diode, and the third light-emitting diode are disposed in the first direction,
the first light-emitting diode overlaps at least one of the storage capacitors,
the second light-emitting diode overlaps the driving voltage line, and
the third light-emitting diode overlaps at least one of the data lines.

8. The display device of claim 1, wherein the scan line further comprises a branch extending in the second direction from the scan line.

9. The display device of claim 1, wherein the transistors comprise:
a first switching transistor electrically connected to the scan line and the first data line of the data lines;
a second switching transistor electrically connected to the scan line and the second data line of the data lines; and
a third switching transistor electrically connected to the scan line and the third data line of the data lines,
wherein a length of a semiconductor layer of the first switching transistor, a length of a semiconductor layer of the second switching transistor, and a length of a semiconductor layer of the third switching transistor are different from one another.

10. The display device of claim 1, wherein the driving voltage line drives all of the first light-emitting diode, the second light-emitting diode, and the third light-emitting diode.

11. A display device comprising:
red, green, and blue pixels;
a scan line extending in a first direction;
data lines extending in a second direction intersecting the first direction;
a driving voltage line extending in the second direction;
storage capacitors disposed adjacent to one another in the second direction, the storage capacitors including a first storage capacitor for a first pixel of the red, green, and blue pixels disposed adjacent to the scan line, a second storage capacitor for a second pixel of the red, green, and blue pixels disposed adjacent to the first storage capacitor in the second direction, and a third storage capacitor for a third pixel of the red, green, and blue pixels disposed adjacent to the second storage capacitor in the second direction,
a first light-emitting diode overlapping the first storage capacitor in plan view,
a second light-emitting diode that does not overlap any storage capacitor in plan view, wherein,
the first, second, and third storage capacitors are disposed adjacent to one another in the second direction such that no scan line traverses between any two adjacent storage capacitors among the first, second, and third storage capacitors,
in a plan view, the first, second, and third storage capacitors are arranged along a first imaginary line parallel to the second direction; and
transistors electrically connected to the storage capacitors, wherein the transistors comprise:
a first switching transistor electrically connected to the scan line and a first data line of the data lines, the first switching transistor disposed adjacent to the first storage capacitor;
a second switching transistor electrically connected to the scan line and a second data line of the data lines, the second switching transistor disposed adjacent to the second storage capacitor; and
a third switching transistor electrically connected to the scan line and a third data line of the data lines, the third switching transistor disposed adjacent to the third storage capacitor.

12. The display device of claim 11, wherein
the second switching transistor is disposed between the first switching transistor and the third switching transistor in the second direction, and
a length of a semiconductor layer of the second switching transistor is greater than a length of a semiconductor layer of the first switching transistor and a length of a semiconductor layer of the third switching transistor.

13. The display device of claim 11, wherein
the transistors comprise a first driving transistor electrically connected to the first storage capacitor, and the first storage capacitor comprises:
a first electrode electrically connected to a gate electrode of the first driving transistor; and
a second electrode overlapping the first electrode.

14. The display device of claim 13, wherein the second electrode comprises:
a first sub-electrode disposed under the first electrode; and
a second sub-electrode disposed over the first electrode and electrically connected to the first sub-electrode.

15. The display device of claim 11, wherein the first light-emitting diode overlaps multiple storage capacitors in plan view.

16. The display device of claim 11, wherein the first light-emitting diode comprises a first pixel electrode electrically connected to the first storage capacitor.

17. The display device of claim 11, wherein the green pixel overlaps all of the storage capacitors in plan view.

18. The display device of claim 11, wherein
the first, second, and third data lines are disposed at a same side of the first imaginary line.

19. The display device of claim 18, wherein
the driving voltage line is disposed at an opposite side of the first, second, and third data lines with respect to the first imaginary line.

20. The display device of claim 18, wherein
the second light-emitting diode is disposed at the first side of the imaginary line, and
the third light-emitting diode is disposed at the second side of the first imaginary line.

* * * * *